(12) United States Patent
Zhang et al.

(10) Patent No.: US 10,572,049 B2
(45) Date of Patent: Feb. 25, 2020

(54) DISPLAY SUBSTRATE, DISPLAY PANEL, SUBSTRATE, TOUCH SUBSTRATE AND CUTTING METHOD OF THE SUBSTRATE

(71) Applicants: BOE TECHNOLOGY GROUP CO., LTD., Beijing (CN); Hefei BOE Optoelectronics Technology Co., Ltd., Anhui (CN)

(72) Inventors: Zhen Zhang, Beijing (CN); Sheng Wang, Beijing (CN); Lisen Wang, Beijing (CN); Peng Li, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 20 days.

(21) Appl. No.: 15/982,014

(22) Filed: May 17, 2018

(65) Prior Publication Data

US 2019/0087040 A1 Mar. 21, 2019

(30) Foreign Application Priority Data

Sep. 20, 2017 (CN) .......................... 2017 1 0855206

(51) Int. Cl.
*G06F 3/044* (2006.01)
*G06F 3/041* (2006.01)
*H01L 23/544* (2006.01)

(52) U.S. Cl.
CPC .......... *G06F 3/0412* (2013.01); *H01L 23/544* (2013.01); *G06F 3/044* (2013.01);
(Continued)

(58) Field of Classification Search
CPC ................... G06F 3/0412; G06F 3/044; G06F 2203/04107; G06F 2203/04103; H01L 23/544; G09G 2300/0426
See application file for complete search history.

(56) References Cited

U.S. PATENT DOCUMENTS 6,172,410 B1 * 1/2001 Nagata .................. G02F 1/1309
257/350
6,195,149 B1 * 2/2001 Kodera ............. G02F 1/133351
349/187

(Continued)

*Primary Examiner* — Carolyn R Edwards
(74) *Attorney, Agent, or Firm* — Calfee, Halter & Griswold LLP

(57) ABSTRACT

A display substrate, a display panel, a substrate, a touch substrate and a cutting method of the substrate are disclosed. The display substrate includes a plurality of imagined touch electrodes, a plurality of connection wires, a grounding electrode and a first cutting alignment mark. The plurality of imagined touch electrodes are located at an imagined touch zone of the display substrate; the plurality of connection wires are located at a bonding zone of the display substrate and are connected with the imagined touch electrodes; the grounding electrode is arranged at the bonding zone and is electrically connected with the a plurality of connection wires; the first cutting alignment mark is arranged at a side of the grounding electrode adjacent to the connection wires, and configured that the grounding electrode being able to be cut away from the display substrate by cutting the display substrate through the first cutting alignment mark.

10 Claims, 3 Drawing Sheets

(52) U.S. Cl.
CPC .............. *G06F 2203/04103* (2013.01); *G06F 2203/04107* (2013.01); *G09G 2300/0426* (2013.01)

(56) References Cited

U.S. PATENT DOCUMENTS

| | | | | |
|---|---|---|---|---|
| 2002/0063843 A1* | 5/2002 | Yu | .......................... | G02F 1/1309 349/187 |
| 2002/0063845 A1* | 5/2002 | Lim | ...................... | G02F 1/1309 349/189 |
| 2015/0077652 A1* | 3/2015 | Lee | ......................... | G06F 3/044 349/12 |
| 2018/0149906 A1* | 5/2018 | Kanehiro | .................. | G09F 9/00 |

* cited by examiner

DISPLAY SUBSTRATE, DISPLAY PANEL, SUBSTRATE, TOUCH SUBSTRATE AND CUTTING METHOD OF THE SUBSTRATE

CROSS-REFERENCE TO RELATED APPLICATIONS

This application is based on and claims priority to Chinese Patent Application No. 201710855206.6, filed on Sep. 20, 2017, the contents of which are incorporated herein by reference in its entirety.

TECHNICAL FIELD

The present disclosure relates to the display field, in particular to a display substrate, a display panel, a substrate, a touch substrate and a cutting method of the substrate.

BACKGROUND

At present, a touch substrate on the market generally performs a touch function by means of touch electrodes on its touch zone. In the production process of the touch substrate, the touch substrate is formed as plural by cutting a substrate. The substrate tends to be a poor quality product for example having corrosion or scratches on the surface caused during transport and storage. Since the touch function is disabled once the surface of a conventional substrate is scratched, i.e. the touch function could not continue to work. Therefore, the scratched or eroded conventional substrate will not continue to be cut into any touch substrates, thereby causing a waste of cost.

SUMMARY

The present disclosure provides a display substrate, a display panel, a substrate, a touch substrate and a cutting method of the substrate.

According to one aspect of the present disclosure, a display substrate is provided, which includes:

a plurality of imagined touch electrodes located at an imaged touch zone of the display substrate;

a plurality of connection wires located at a bonding zone of the display substrate and connected with the plurality of imagined touch electrodes;

a grounding electrode arranged at the bonding zone and electrically connected with the plurality of connection wires; and a first cutting alignment mark arranged at a side of the grounding electrode adjacent to the plurality of connection wires, and configured that the grounding electrode being able to be cut away from the display substrate by cutting the display substrate through the first cutting alignment mark.

According to an embodiment of the present disclosure, the plurality of connection wires correspond to the plurality of touch electrodes respectively in one-to-one correspondence.

According to another aspect of the present disclosure, a display panel is provided, wherein the display panel includes the display substrate mentioned above and an opposite substrate opposite to the display substrate, the grounding electrode being electrically connected to a grounding terminal on the opposite substrate.

According to an embodiment of the present disclosure, the grounding electrode is connected to the grounding terminal on the opposite substrate by a conductive silver paste.

According to another aspect of the present disclosure, a substrate is provided, which includes:

a plurality of imagined touch electrodes located at an imaged touch zone of the substrate;

a plurality of connection wires located at a bonding zone of the substrate and connected with the plurality of imagined touch electrodes;

an imaged grounding electrode arranged at the bonding zone and electrically connected with the plurality of connection wires;

a first cutting alignment mark arranged at a side of the imaged grounding electrode adjacent to the plurality of connection wires; and a second cutting alignment mark arranged at a side of the imaged grounding electrode away from the connection wires;

wherein the first cutting alignment mark is configured that the imaged grounding electrode being able to be cut away from the substrate by cutting the substrate through the first cutting alignment mark, and the second cutting alignment mark is configured that the imaged grounding electrode being able to be retained on the substrate by cutting the substrate through the second cutting alignment mark.

According to an embodiment of the present disclosure, a distance between the first cutting alignment mark and the second cutting alignment mark is about 100 μm-400 μm, and a width of the imaged grounding electrode is about 50 μm-200 μm.

According to an embodiment of the present disclosure, the imaged grounding electrode, the plurality of imagined touch electrodes and the plurality of connection wires are located at the same layer.

According to further aspect of the present disclosure, a cutting method of the substrate mentioned above is provided, wherein the cutting method includes the following steps:

detecting a surface of the substrate to sort out a substrate having a damaged touch film and a substrate having an undamaged touch film, respectively;

with respect to the substrate having a damaged touch film, cutting the substrate having a damaged touch film through the second cutting alignment mark to form a display substrate; and with respect to the substrate having an undamaged touch film, cutting the substrate having an undamaged touch film through the first cutting alignment mark to form a touch substrate.

According to further aspect of the present disclosure, a touch substrate is provided, which is formed by cutting with the cutting method mentioned above.

Additional features and advantages of the present disclosure will be set forth in the following description, and will be partly apparent from the description, or may be learned by implementing the present disclosure. The objectives and other advantages of the present disclosure may be realized and obtained by the structure specially pointed out in the description, claims and accompanying drawings.

BRIEF DESCRIPTION OF THE DRAWINGS

The accompanying drawings are used to provide a further understanding of technical solutions of the present disclosure and constitute part of the description, and are also intended to explain technical solutions of the present disclosure together with embodiments of the present application and do not constitute limitations on the technical solutions of the present disclosure.

DETAILED DESCRIPTION

In order to more clearly understand objectives, solutions and advantages of the present disclosure, embodiments of the present disclosure will be described in detail with reference to the accompanying drawings. It should be noted that embodiments in the present application and features in the embodiments may be arbitrarily combined with each other.

Figure 1:
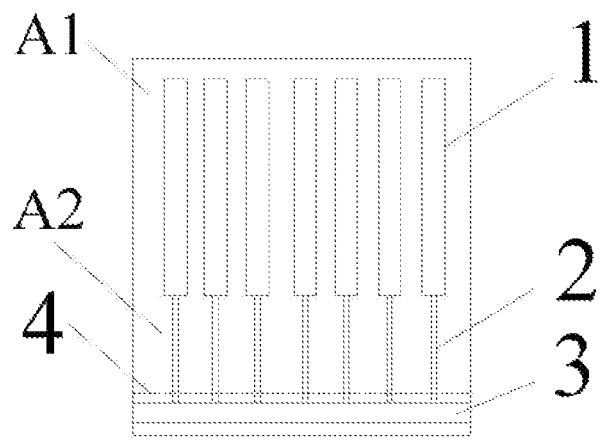
FIG. 1 is a schematic structural diagram of a display substrate according to an embodiment of the present disclosure.

As shown in FIG. 1, a display substrate is provided. The display substrate is formed by vertically superposing a CF substrate and a TFT substrate. A touch film is provided on a surface of the display substrate, an imaged touch zone A1 is provided above the touch film, a bonding zone A2 is provided below the imaged touch zone A1, a plurality of imagined touch electrodes 1 are provided on the imaged touch zone A1, a plurality of connection wires 2 are provided on the bonding zone A, the plurality of connection wires 2 are located under the plurality of imagined touch electrodes 1, and connection wires 2 are connected with imagined touch electrodes 1 in one-to-one correspondence. In this embodiment, imagined touch electrodes 1 and connection wires 2 are partitionally arranged, i.e., imagined touch electrodes as well as connection wires 2 are respectively spaced apart; imagined touch electrodes 1 and connection wires 2 on the display substrate are both made of indium tin oxide (ITO). A grounding electrode 3 is also provided on the bonding zone A2 of the display substrate. Imagined touch electrodes 1, the plurality of connection wires 2 and the grounding electrode 3 are located at the same layer. The grounding electrode 3 is located at ends of the plurality of connection wires 2 away from the imagined touch electrodes 1and is made of ITO thin film with an elongated shape. Both ends of the grounding electrode 3 respectively run through edges on both sides of the display substrate. Ends of the plurality of connection wires 2 away from imagined touch electrodes 1 are respectively electrically connected to the elongated-shape grounding electrode 3. A first cutting alignment mark 4 is provided at a side of the grounding electrode 3 adjacent to connection wires 2, and both ends of the first cutting alignment mark 4 extend to edges on both sides of the substrate.

In this embodiment, the display substrate is formed in such a manner that, after a touch function of the substrate is disabled when the surface of the substrate is scratched or eroded, i.e. imagined touch electrodes 1 and/or connection wires 2 of the surface of the substrate are scratched or eroded, the disabled substrate is cut while the grounding electrode 3 is remained on the substrate. That is to say, there is no touch function when the surface of the display substrate is subject to be scratched or eroded; in this embodiment, the grounding electrode 3 on the display substrate serves to reuse the touch film disabled on the display substrate. After grounding the grounding electrode 3, the disabled touch film is able to be used as an electrostatic shielding layer, thereby reducing a waste of the substrate and saving cost.

Figure 3:
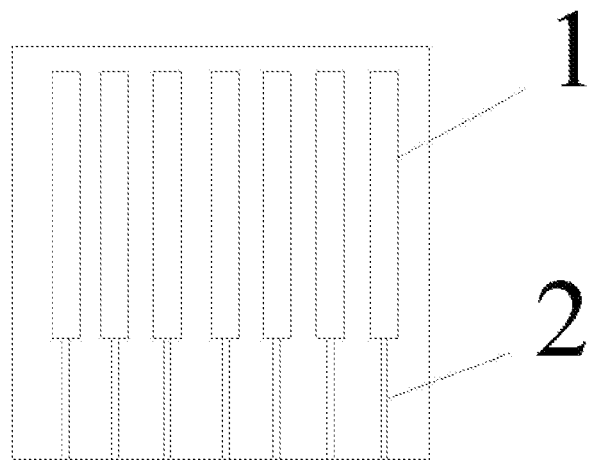
FIG. 3 is a schematic structural diagram of a touch substrate according to an embodiment of the present disclosure.

In this embodiment, the first cutting alignment mark 4 on the display substrate is used for cutting the grounding electrode 3 away from the substrate. When the surface of the substrate is undamaged, the grounding electrode 3 can be cut away from the substrate through the first cutting alignment mark 4 to form a touch substrate, as shown in FIG. 3.

In this embodiment, the grounding electrode 3 may be other shapes in addition to the elongated shape as mentioned above. For example, the grounding electrode 3 is an ITO thin film in a shape of rectangle, circle, rhombus and the like arranged on the bonding zone A2; otherwise, the grounding electrode 3 is an elongated shape without its both ends run through edges at both sides of the substrate, for example.

Figure 4:
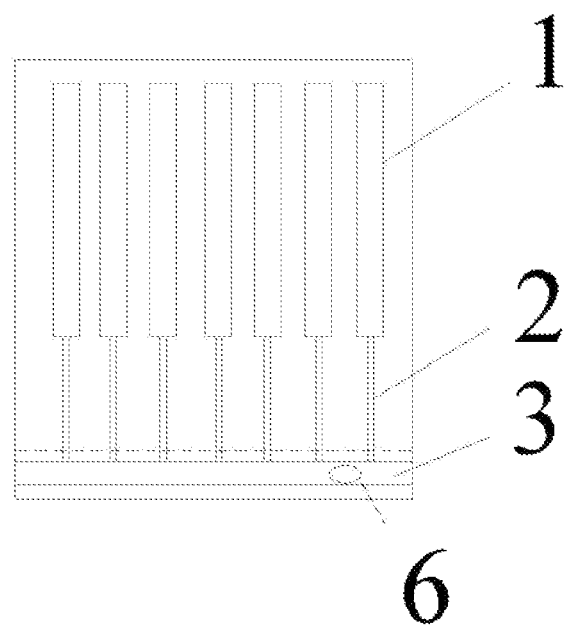
FIG. 4 is a schematic structural diagram of a display panel according to an embodiment of the present disclosure.
Figure 5:
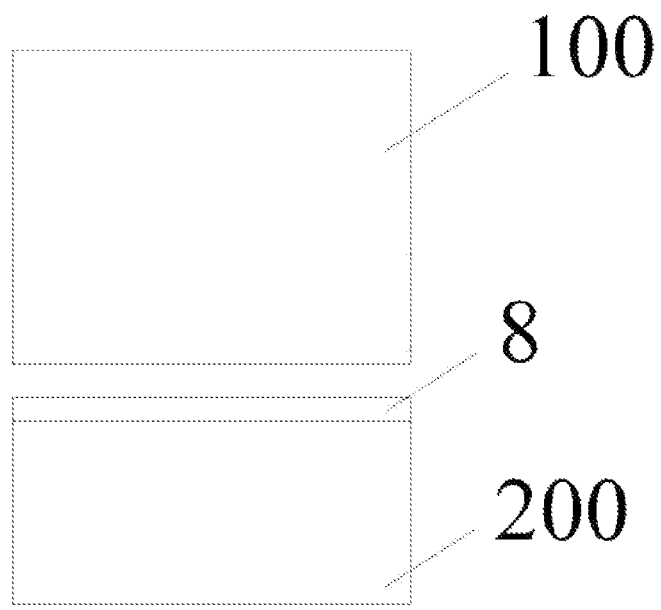
FIG. 5 is a schematic structural diagram of a display panel according to an embodiment of the present disclosure.

As shown in FIGS. 4 and 5, a display panel is provided, including the display substrate 100 as mentioned above and an opposite substrate 200 opposite to the display substrate 100. The grounding electrode 3 on the display substrate is electrically connected with a grounding terminal on the opposite substrate by an electric connector so as to enable the grounding electrode 3 grounded, so that the electrostatic shielding layer is formed by the disabled touch film on the display substrate; in this embodiment, the grounding electrode 3 is coated with a conductive silver pastes 6, and the grounding electrode 3 is electrically connected with the grounding terminal on the opposite substrate by the conductive silver paste 6. This type of connection is convenient to manufacture and easy to operate.

Figure 2:
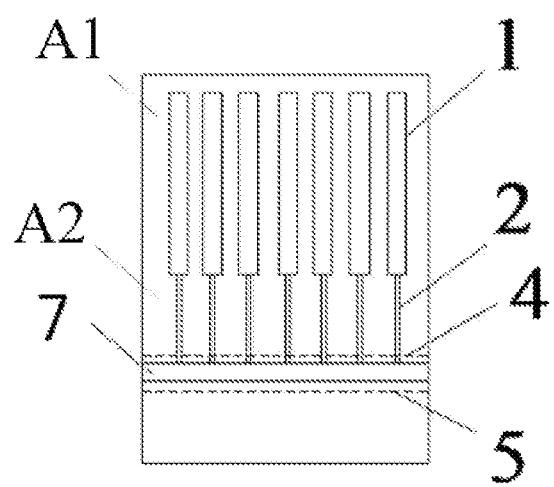
FIG. 2 is a schematic structural diagram of a substrate according to an embodiment of the present disclosure.

As shown in FIG. 2, a substrate is provided. A touch film is provided on a surface of the substrate. An imaged touch zone A1 is provided above the touch film, a bonding zone A2 is provided under the imaged touch zone A1, a plurality of imagined touch electrodes 1 are provided on the imaged touch zone A1, a plurality of connection wires 2 are provided on the bonding zone A2, a plurality of connection wires 2 are located under a plurality of imagined touch electrodes 1, and connection wires 2 are connected with the imagined touch electrodes 1 in one-to-one correspondences. In this embodiment, imagined touch electrodes 1 and connection wires 2 are both made of indium tin oxide (ITO). An imaged grounding electrode 7 is also provided on the bonding zone A2 of the substrate. Imagined touch electrodes 1, a plurality of connection wires 2 and the imaged grounding electrode 7 are located at the same layer. The imaged grounding electrode 7 is located at ends of the plurality of connection wires 2 away from touch electrodes 1. The imaged grounding electrode 7 is an ITO thin film with an elongated shape. Both ends of the imaged grounding electrode 7 respectively run through edges on both sides of the display substrate. Ends of the plurality of connection wires 2 away from touch electrodes 1 are respectively electrically connected on the elongated-shape imaged grounding electrode 7. A first cutting alignment mark 4 is provided at a side of the imaged grounding electrode 7 adjacent to connection wires 2, and a second cutting alignment mark 5 is provided at a side of the imaged grounding electrode 7 away from connection wires 2. Both ends of the first cutting alignment mark 4 and the second cutting alignment mark 5 respectively extend to edge on both sides of the substrate. The imaged grounding electrode 7 is located between the first cutting alignment mark 4 and the second cutting alignment mark 5. A distance between the first cutting alignment mark 4 and the second cutting alignment mark 5 is about 100 μm-400 μm with error of 10 μm, the distance, for example, is 98 μm, 99 μm, 150 μm, 200 μm, 300 μm, 401 μm, 409 μm, a width of the imaged grounding electrode 7 is about 50 μm-200 μm with error of 5 μm, the width, for example, is 48 μm, 49 μm, 100 μm, 201 μm, 205 μm, and the width of the imaged grounding electrode 7 is smaller than the distance between the first cutting alignment mark 4 and the second cutting alignment mark 5, so that the imaged grounding electrode 7 is entirely located therebetween.

As shown in FIG. 2, after a touch function of the substrate is disabled when the surface of the substrate is scratched or eroded, i.e. imagined touch electrodes 1 and/or connection wires 2 of the surface of the substrate are scratched or eroded, the substrate is cut away through the second cutting alignment mark 5 to remain the imaged grounding electrode 7 on the substrate thereby forming the display substrate as shown in FIG. 1, then to enable the imaged grounding electrode 7 grounded so that the disabled touch film on the surface of the substrate can be used as an electrostatic shielding layer; the surface of the substrate has a touch function when it is undamaged, while the touch substrate as shown in FIG. 3 is formed by cutting the substrate through the first cutting alignment mark 4 to cut the imaged grounding electrode 7 away from the substrate. In this embodiment, the imaged grounding electrode 7 on the substrate and the second cutting alignment mark 5 enable the disabled substrate to be reused, thereby reducing the waste of the substrate and saving cost.

The present disclosure further provides a cutting method of a substrate including the following steps:

detecting damage extent of a surface of the substrate by an instrument to respectively sort out a substrate having a damaged touch film and a substrate having an undamaged touch film, the substrate having a damaged touch film means a substrate having a scratched or eroded surface with its touch function disabled, and the substrate having an undamaged touch film means a substrate having an undamaged surface of which touch function enables to be normally used;

cutting the substrate having a damaged touch film through the second cutting alignment mark 5 thereon so that the imaged grounding electrode 7 of the substrate having a damaged touch film is remained on the substrate having a damaged touch film, thereby forming the display substrate as mentioned above, as shown in FIG. 1; and cutting the substrate having an undamaged touch film through the first cutting alignment mark 4 thereon so that the imaged grounding electrode 7 of the substrate having an undamaged touch film is cut away from the substrate having an undamaged touch film, thereby forming the touch substrate, as shown in FIG. 3.

The cutting method of the substrate provided by this embodiment allows a substrate with a disabled touch function made into a display substrate, and allows a substrate with an undamaged touch function made into a touch substrate, in order to enable the substrate having a damaged touch film to be reused, thereby reducing a waste of the substrate and saving cost.

As shown in FIG. 3, a touch substrate is provided. The touch substrate is formed by the cutting method of the substrate, i.e. the substrate having an undamaged touch film is sorted out by an instrument, and the imaged grounding electrode 7 is cut away from the substrate through the first cutting alignment mark 4 on the substrate to form the touch substrate.

Compared to the related art, beneficial effects of the present disclosure are:

1. The display substrate in the present disclosure is formed in such a manner that after a touch function of the substrate is disabled when the surface of the substrate is scratched or eroded, the disabled substrate is cut away to remain the grounding electrode on the substrate, so that the disabled touch film on the substrate is reused by the display substrate in order to enable the grounding electrode thereon grounded to be used as an electrostatic shielding layer, thereby reducing a waste of the substrate and saving cost.

2. The display panel in the present disclosure provides electrical connection between the grounding electrode of the display substrate and grounding terminal of the opposite substrate, so that the disabled touch film on the display substrate forms an electrostatic shielding layer, thereby reusing the disabled touch film and saving cost.

3. In the present disclosure, the grounding electrode of the display panel is connected to the ground by a conductive silver paste, which facilitates the electrical connection between the grounding electrode and the grounding terminal of the opposite substrate and has simple operation.

4. A first cutting alignment mark and a second cutting alignment mark are provided on the substrate in the present disclosure. After a touch function of the substrate is disabled when the surface of the substrate is scratched or eroded, the substrate is cut through the second cutting alignment mark, so that the imaged grounding electrode is remained on the substrate and the imaged grounding electrode is grounded to form the electrostatic shielding layer; when the surface of the substrate is undamaged, the imaged grounding electrode may be cut away from the substrate by cutting the substrate through the first cutting alignment mark to form the touch substrate; the imaged grounding electrode on the substrate and the second cutting alignment mark enable the substrate with a disabled touch function to be reused, thereby reducing a waste of the substrate and saving cost.

5. A cutting method of the substrate in the present disclosure allows a substrate with a disabled touch function made into a display substrate, and allows a substrate with an undamaged touch function made into a touch substrate, thereby reducing a waste of the substrate and saving cost.

Although embodiments disclosed by the present disclosure are described above, the contents described are merely implementation used to understand the present disclosure and not intended to limit the present disclosure. Any modifications and changes can be made for forms and details of implementation by those skilled in the art of the present disclosure without departing from the spirit and scope of the present disclosure, but the patent protection scope of the present disclosure still needs to be defined by claims.

What is claimed is:

1. A display substrate comprising:
   a plurality of imagined touch electrodes located at an imaged touch zone of the display substrate;
   a plurality of connection wires located at a bonding zone of the display substrate and connected with the plurality of imagined touch electrodes;
   a grounding electrode arranged at the bonding zone and electrically connected with the plurality of connection wires; and
   a first cutting alignment mark arranged at a side of the grounding electrode adjacent to the plurality of connection wires, and so configured that the grounding electrode is able to be cut away from the display substrate by cutting the display substrate through the first cutting alignment mark;
   a second cutting alignment mark arranged at a side of the imaged grounding electrode away from the connection wires, the second cutting alignment mark oriented such that it does not intersect with the first cutting alignment mark; and the second cutting alignment mark is so configured that the imaged grounding electrode is able to be retained on the substrate by cutting the substrate through the second cutting alignment mark.

2. The display substrate according to claim 1, wherein the plurality of connection wires correspond to the plurality of touch electrodes respectively in one-to-one correspondence.

3. A display panel, comprising the display substrate according to claim 1 and an opposite substrate opposite to the display substrate, the grounding electrode being electrically connected to a grounding terminal on the opposite substrate.

4. The display panel according to claim 3, wherein the grounding electrode is connected to the grounding terminal on the opposite substrate by a conductive silver paste.

5. A substrate comprising:
a plurality of imagined touch electrodes located at an imagined touch zone of the substrate;
a plurality of connection wires located at a bonding zone of the substrate and connected with the plurality of imagined touch electrodes;
an imaged grounding electrode arranged at the bonding zone and electrically connected with the plurality of connection wires;
a first cutting alignment mark arranged at a side of the imaged grounding electrode adjacent to the connection wires; and
a second cutting alignment mark arranged at a side of the imaged grounding electrode away from the connection wires, the second cutting alignment mark oriented such that it does not intersect with the first cutting alignment mark;
wherein the first cutting alignment mark is so configured that the imaged grounding electrode is able to be cut away from the substrate by cutting the substrate through the first cutting alignment mark, and the second cutting alignment mark is so configured that the imaged grounding electrode is able to be retained on the substrate by cutting the substrate through the second cutting alignment mark.

6. The substrate according to claim 5, wherein a distance between the first cutting alignment mark and the second cutting alignment mark is about 100 μm-400 μm, and a width of the imaged grounding electrode is about 50 μm-200 μm.

7. The substrate according to claim 5, wherein the imaged grounding electrode, the plurality of imagined touch electrodes and the plurality of connection wires are located at the same layer.

8. The substrate according to claim 6, wherein the imaged grounding electrode, the plurality of imagined touch electrodes and the plurality of connection wires are located at the same layer.

9. A cutting method of the substrate according to claim 5, wherein the cutting method comprising the following steps:
detecting a surface of the substrate to sort out a substrate having a damaged touch film and a substrate having an undamaged touch film, respectively;
with respect to the substrate having a damaged touch film, cutting the substrate having a damaged touch film through the second cutting alignment mark to form a display substrate; and
with respect to the substrate having an undamaged touch film, cutting the substrate having an undamaged touch film through the first cutting alignment mark to form a touch substrate.

10. A touch substrate formed by cutting with the cutting method according to claim 9.

* * * * *